United States Patent [19]
Sano et al.

[11] Patent Number: 5,589,711
[45] Date of Patent: Dec. 31, 1996

[54] SEMICONDUCTOR PACKAGE

[75] Inventors: Toshifumi Sano; Masahiro Yamada; Yoshiaki Umezawa; Yoshikatsu Okada; Akira Natori, all of Tokyo, Japan

[73] Assignees: NEC Corporation; Japan Aviation Electronics Industry, Limited, both of Japan

[21] Appl. No.: 365,502

[22] Filed: Dec. 28, 1994

[30] Foreign Application Priority Data

Dec. 29, 1993 [JP] Japan .................. 5-351496

[51] Int. Cl.$^6$ .................. H01L 23/34; H01L 23/552
[52] U.S. Cl. .................. 257/718; 257/659; 257/719; 257/723; 257/726; 361/710; 361/719
[58] Field of Search .................. 257/718, 719, 257/659, 660, 722, 723, 724, 727; 361/709, 710, 711, 719, 720

[56] References Cited

U.S. PATENT DOCUMENTS

| | | | |
|---|---|---|---|
| 3,911,327 | 10/1975 | Murari et al. | 257/719 |
| 3,946,276 | 3/1976 | Braun et al. | 257/719 |
| 4,415,025 | 11/1983 | Horvath | 257/718 |
| 4,593,342 | 6/1986 | Lindsay | 257/718 |
| 4,807,019 | 2/1989 | Tustaniwskyj | 357/74 |
| 5,175,613 | 12/1992 | Barker, III et al. | 257/713 |
| 5,305,185 | 4/1994 | Samarov et al. | 361/704 |
| 5,371,404 | 12/1994 | Juskey et al. | 257/659 |
| 5,375,652 | 12/1994 | Matsunaga et al. | 257/718 |

FOREIGN PATENT DOCUMENTS

| | | | |
|---|---|---|---|
| 0340959 | 4/1989 | European Pat. Off. | H01L 23/56 |
| 2630859 | 11/1988 | France. | |
| 8808615 | 11/1988 | WIPO. | |

OTHER PUBLICATIONS

Nikkei Electronics, vol. 1985.7.15, pp. 270–278 (1985).
Nikkei Microdevices, vol. 1993.8, pp. 61–63 (1993).

*Primary Examiner*—Sara W. Crane
*Assistant Examiner*—David Ostrowski
*Attorney, Agent, or Firm*—Hayes, Soloway, Hennessey, Grossman & Hage, P.C.

[57] ABSTRACT

In a semiconductor package comprising a heat spreader, a heat sink, a wiring board, and a connector, a heat spreader mounted on a remaining region of the upper surface of a substrate. The heat sink is thermally connected to a primary integrated circuit chip through the heat spreader and to a secondary integrated circuit chip. The heat sink has electrical conductivity. The heat sink comprises a base plate and at least one connecting member which perpendicularly extends from the base plate. A wiring board has a plurality of contact holes and a plurality of contact slits. A connector is mounted on the wiring board. The connector has a plurality of contacts. The contacts comprises a plurality of socket portions and a plurality of terminal portions. The contacts are connected to an input/output pins with the input/output pins inserted into the respective socket portions. The terminal portions are inserted into the respective contact holes. The connector has at least one ground contact. The ground contact comprises a ground socket portion and a ground terminal portion. The at least one ground contact is electrically connected to the at least one connecting member with the connecting member inserted into the ground socket portion. The ground terminal portions are inserted into the contact slits.

18 Claims, 8 Drawing Sheets

SEMICONDUCTOR PACKAGE

BACKGROUND OF THE INVENTION

This invention relates to a semiconductor package, having a heat sink, which packages an integrated circuit chip and, more particularly, to a multi-chip package which makes it possible to cool a multi-chip module and to a shielding package which makes it possible to shield a multi-chip module from electromagnetic interference.

A conventional multi-chip package has been proposed in a paper contributed to a technical report, Vol. 1985. 7. 15, pages 270–278 under the title of "NIKKEI ELECTRONICS". The conventional multi-chip package comprises a plurality of integrated circuit chips, a ceramic substrate, a heat sink, and a plurality of input/output pads. The integrated circuit chips are mounted on a lower surface of the ceramic substrate. The heat sink is fixed on an upper surface of the ceramic substrate. Each of the integrated circuit chips generates heat which is conducted to the heat sink through the ceramic substrate. The heat conducted from the heat sink dissipates in the air.

Another conventional multi-chip package has been proposed in a paper contributed to a technical report, Vol. 1993. 8, pages 61–63 under the title of "NIKKEI MICRODEVICES". Another conventional multi-chip package comprises microprocessor chip, a ceramic substrate having a cavity section at a lower surface thereof, a plurality of surface mount type packages, and a plurality of input/output pins. The surface mount type packages are mounted on an upper surface of the ceramic substrate. Each of the surface mount type packages includes a static RAM. The microprocessor chip is held in the cavity section. The microprocessor chip generates a heat larger than that which is generated from the static RAMs.

A conventional shielding package has been disclosed in a European Patent Application, Publication Number: 0 340 959. The conventional shielding package comprises a wiring board, a plurality of large scale integrated (LSI) circuit chips, a heat sink, a screw, and a nut. Both LSI circuit chips and a heat sink are mounted on the wiring board. The heat sink is fixed to the wiring board by the screw and the nut. An electromagnetic wave generated from the LSI circuit chips is shielded by the heat sink.

However, the above-mentioned semiconductor package has following problems.

In the above-mentioned another conventional multi-chip package, when the heat sink is fixed on the ceramic substrate so that the heat sink is located just above the microprocessor chip, the cooling efficiency of the surface mount type packages is poor, because the surface mount type package is located at the lee of the heat sink.

To solve the above-mentioned problem, previously, potting has been formed around each of the surface mount type packages so that the heat is conducted to the ceramic substrate. However, in that event, it is difficult to detach the surface mount type packages. When each of the surface mount type packages is modified into a bare chip, similarly, it is difficult to detach the bare chip.

In the above-mentioned conventional shielding package, since the heat sink is fixed to the wiring board by the screw and the nut, a long time is required to detach the heat sink and to attach the heat sink.

SUMMARY OF THE INVENTION

It is therefore an object of this invention to provide a semiconductor package which improves the cooling efficiency of the surface mount type packages.

It is another object of this invention to provide a semiconductor package wherein it is easy to detach the surface mount type packages.

It is still another object of this invention to provide a semiconductor package which does not take time to detach the heat sink and to attach the heat sink.

According to an aspect of this invention, a multi-chip package for packaging a multi-chip module comprises a substrate having upper and lower surfaces, a primary integrated circuit chip mounted on the lower surface of the substrate, and secondary integrated circuit chips mounted on a predetermined region of the upper surface of the substrate. The multi-chip package comprises a heat spreader mounted on a remaining region of the upper surface of the substrate. A heat sink is thermally connected to the secondary integrated circuit chip and to the primary integrated circuit chip through the heat spreader.

According to another aspect of this invention, a shielding package is for shielding a semiconductor device from electromagnetic interference. The semiconductor device comprises a substrate having upper and lower surfaces and having a plurality of input/output pins, and an integrated circuit chip mounted on the lower surface of the substrate. The shielding package comprises a heat spreader mounted on the upper surface of the substrate. A heat sink is thermally connected to the integrated circuit chip through the heat spreader. The heat sink has electrical conductivity. The heat sink comprises a base plate and at least one connecting member which perpendicularly extends from the base plate. A wiring board has a plurality of contact holes and a plurality of contact slits. A connector is mounted on the wiring board. The connector has a plurality of contacts. The contacts comprise a plurality of socket portions and a plurality of terminal portions. The contacts are connected to the input/output pins with the input/output pins inserted into the respective socket portions. The terminal portions are inserted into the respective contact holes. The connector has at least one ground contact. The at least one ground contact comprises a ground socket portion and a ground terminal portion. The at least one ground contact is electrically connected to the at least one connecting member with the connecting member inserted into the ground socket portion. The ground terminal portions are inserted into the contact slits.

According to still another aspect of this invention, a multi-chip shielding package is for packaging a multi-chip module and is for shielding the multi-chip module from electromagnetic interference. The multi-chip module comprises a substrate having upper and lower surfaces. The multi-chip module has a plurality of input/output pins, a primary integrated circuit chip mounted on the lower surface of the substrate, and secondary integrated circuit chips mounted on a predetermined region of the upper surface of the substrate. The primary integrated circuit chip is mounted on the lower surface of the substrate. The multi-chip shielding package comprises a heat spreader mounted on a remaining region of the upper surface of the substrate. A heat sink is thermally connected to the primary integrated circuit chip through the heat spreader and to the secondary integrated circuit chips. The heat sink has electrical conductivity. The heat sink comprises a base plate and at least one connecting member which perpendicular extends from the base plate. A wiring board has a plurality of contact holes and a plurality of contact slits. A connector is mounted on the wiring board. The connector has a plurality of contacts. The contacts comprise a plurality of socket portions and a plurality of terminal portions. The contacts are connected to the input/output pins with the input/output pins inserted into the respective socket portions. The terminal portions are inserted into the respective contact holes. The connector has at least one ground contact. The ground contact comprises a ground socket portion and a ground terminal portion. The at least one ground contact is electrically connected to the at least one connecting member with the connecting member inserted into the ground socket portion. The ground terminal portions are inserted into the contact slits.

DESCRIPTION OF THE PREFERRED EMBODIMENTS

Figure 1:
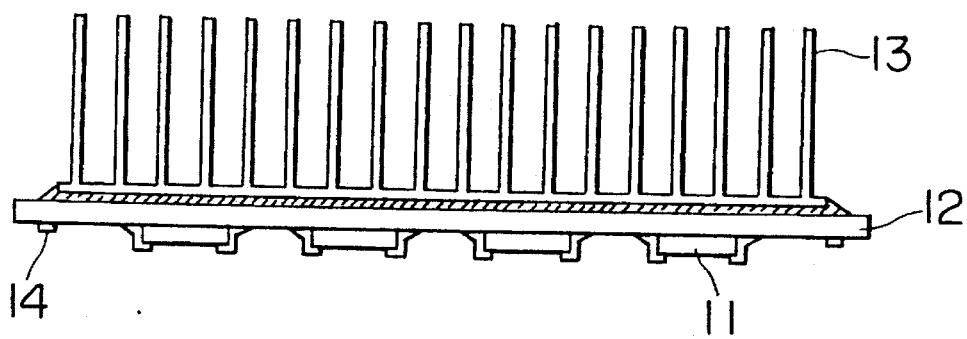
FIG. 1 is a front view showing constitution of a conventional multi-chip package.
Figure 2:
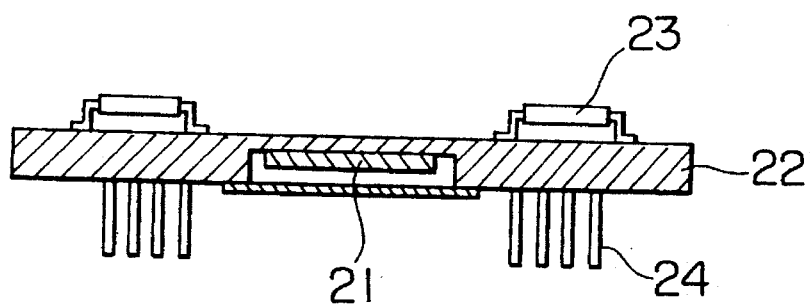
FIG. 2 is a partial sectional view showing constitution of another conventional multi-chip package, with a heat sink excepted.
Figure 3:
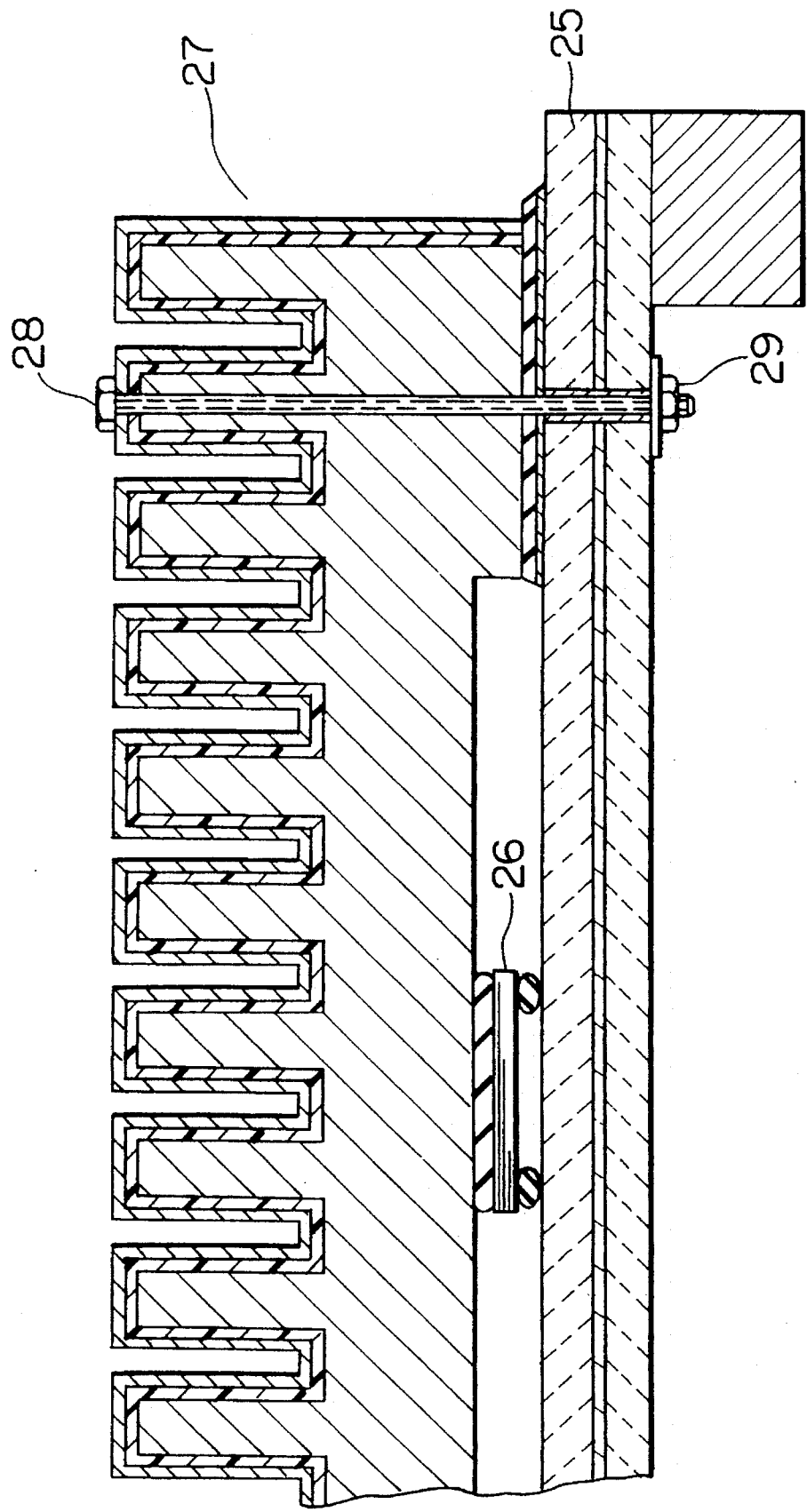
FIG. 3 is a partial cross-sectional view showing constitution of a conventional shielding package.

Referring to FIGS. 1, 2, and 3, both a conventional multi-chip package for cooling a multi-chip module and a shielding package for shielding a multi-chip module from electromagnetic interference will be described at first in order to facilitate an understanding of the present invention. The multi-chip module consists of a wiring board and a plurality of integrated circuit chips mounted on the wiring board.

FIG. 1 is a front view showing constitution of a conventional multi-chip package. FIG. 2 is a partial sectional view showing constitution of another conventional multi-chip package, with a heat sink excepted. FIG. 3 is a partial cross-sectional view showing constitution of a conventional shielding package.

In FIG. 1, the conventional multi-chip package comprises a plurality of integrated circuit chips 11, a ceramic substrate 12, a heat sink 13, and a plurality of input/output pads 14. The integrated circuit chips 11 are mounted on a lower surface of the ceramic substrate 12. The heat sink 13 is fixed on an upper surface of the ceramic substrate 12. Each of the integrated circuit chips 11 generates heat which is conducted to the heat sink 13 through the ceramic substrate 12. The heat conducted from the heat sink 13 dissipates in the air.

In FIG. 2, another conventional multi-chip package comprises microprocessor chip 21, a ceramic substrate 22 having a cavity section at a lower surface thereof, a plurality of surface mount type packages 23, and a plurality of input/output pins 24. The surface mount type packages 23 are mounted on an upper surface of the ceramic substrate 12. Each of the surface mount type packages 23 includes a static RAM. The microprocessor chip 21 is held in the cavity section. The microprocessor 21 generates a heat larger than that which is generated from the static RAMs.

In FIG. 3, the conventional shielding package comprises a wiring board 25, a plurality of large scale integrated (LSI) circuit chips 26, a heat sink 27, a screw 28, and a nut 29. Both LSI circuit chips 26 and a heat sink 27 are mounted on the wiring board 25. The heat sink 27 is fixed to the wiring board 25 by the screw 28 and the nut 29. An electromagnetic wave generated from the LSI circuit chips 26 is shielded by the heat sink 27.

Figure 4:
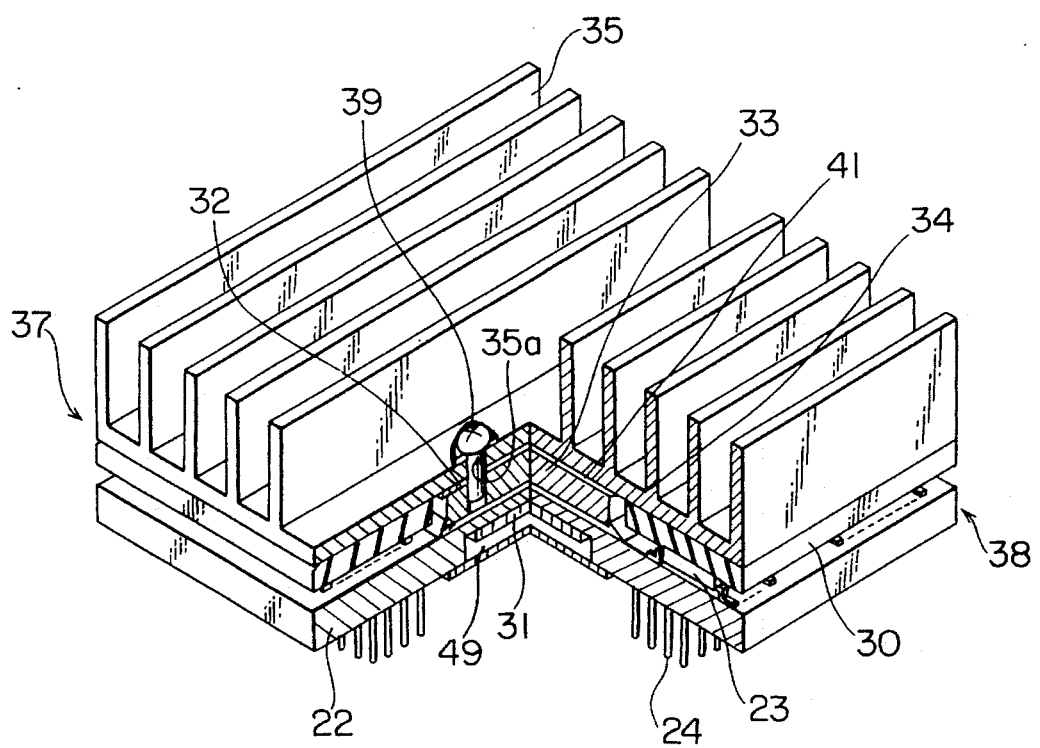
FIG. 4 is a perspective view showing constitution of a multi-chip package according to a first embodiment, with a portion cut away.

Referring to FIG. 4, the description will proceed to a multi-chip package for cooling the multi-chip module according to a first embodiment of the present invention FIG. 4 is a perspective view showing constitution of a multi-chip package according to a first embodiment, with a portion cut away. As shown in FIG. 4, a multi-chip package comprises a dissipation section 37 and a multi-chip module 38. The dissipation section 37 comprises a heat spreader 33 and a heat sink 35. The multi-chip module 38 comprises a substrate 22, a primary integrated circuit chip 31, and secondary integrated circuit chips (not shown). It is to be noted that the primary integrated circuit chip 31 has heat generation amount which is larger than that of the secondary integrated circuit chip.

The substrate 22 has upper and lower surfaces. The substrate 22 has a cavity section 49 at the lower surface. The primary integrated circuit chip 31 is mounted on the lower surface of the substrate 22 with the primary integrated circuit chip 31 held in the cavity section 49. It is desirable that the primary integrated circuit chip 31 is bare chip, because this raises heat-dissipating efficiency. The secondary integrated circuit chips are mounted on a predetermined region of the upper surface of the substrate 22.

Figure 5:
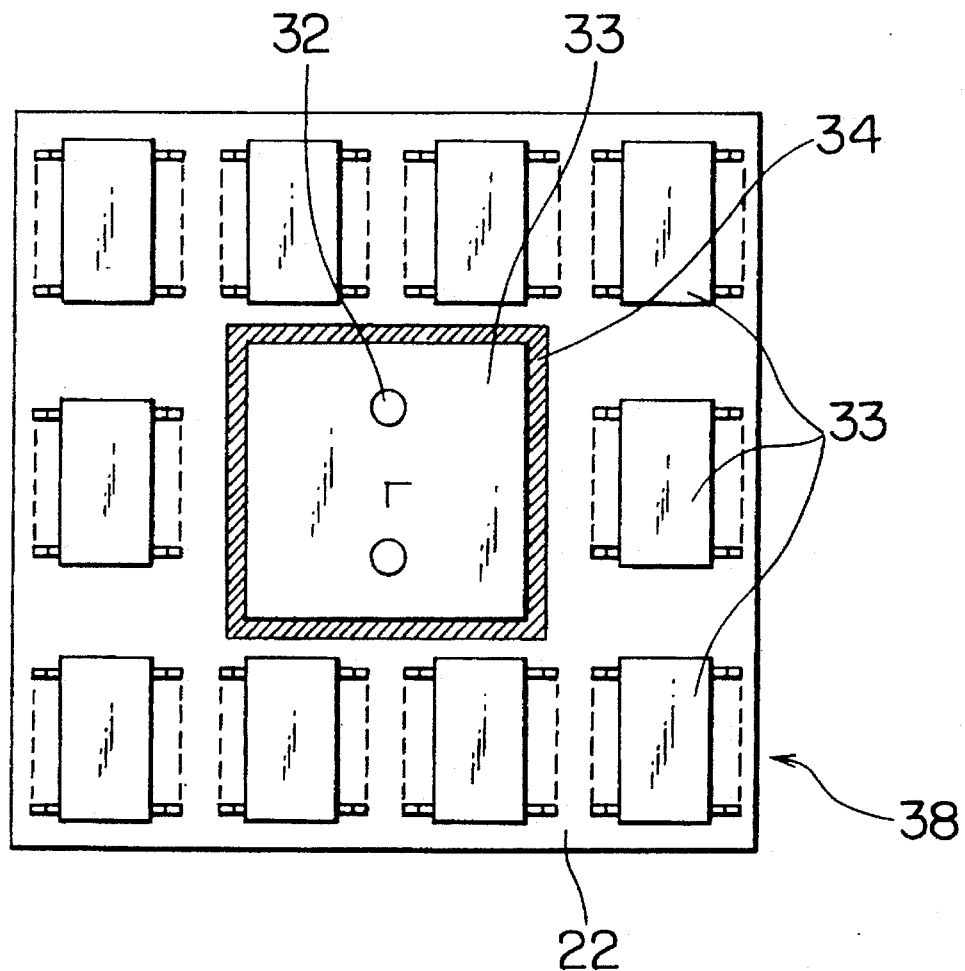
FIG. 5 is a plan view showing constitution of a multi-chip module according to a first embodiment of this invention.
Figure 6:
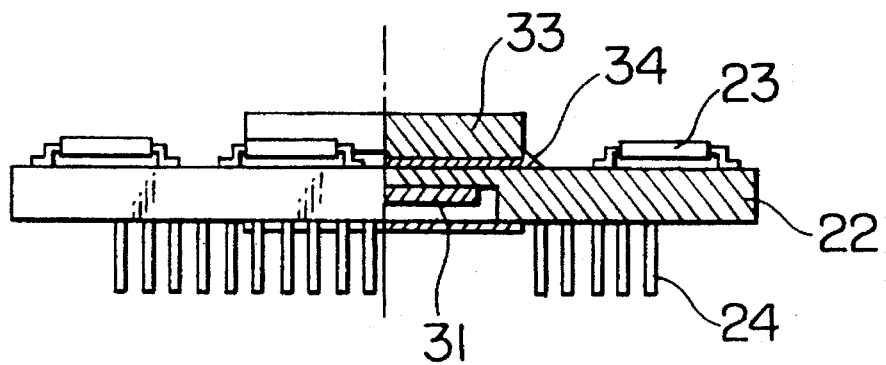
FIG. 6 is a partial sectional view showing constitution of a multi-chip package according to a first embodiment of this invention, with a heat sink excepted.

As shown in FIGS. 5 and 6, each of the secondary integrated circuit chips is received within a surface mount package 23. The surface mount package 23 is mounted on the upper surface of the substrate 22 by soldering. The multi-chip module 38 consists of the substrate 22 and the surface mount packages 23 mounted on the substrate 22. The heat spreader 33 is mounted on a remaining region of the upper surface of the substrate 22. A heat transfer sheet 41 is coated on the heat spreader 33. The heat sink 35 is mounted on the heat transfer sheet 41. The heat sink 35 is thermally connected to the primary integrated circuit chip 31 through the heat spreader 33. The heat sink 35 has at least one heat sink hole 35a. The heat spreader 33 is a thermal conductive mounting plate in which a threaded hole 32 is threaded. The heat sink 35 is fixed to the thermal conductive mounting plate 33 by screwing a screw 39 into the threaded hole 32. A flexible thermal conductive member 30 is inserted between the surface mount packages 23 and the heat sink 35. The heat sink 35 is thermally connected to the secondary integrated circuit chips 23 through the flexible thermal conductive members 30, since both the heat sink 35 and the surface mount package 23 are bonded to the flexible thermal conductive members 30. The heat sink 35 is thermally connected to the primary integrated circuit chip 31 through the heat spreader 33 and the heat transfer sheet 41, since the heat sink 35 and the primary integrated circuit chip 31 are bonded to the heat transfer sheet 41 and the heat spreader 33, respectively.

In this case, since the flexible thermal conductive members 30 have excellent thermal conductivity as described in the following, a first thermal conductive path between the heat sink 35 and the surface mount package 23 is low in the heat resistance. Similarly, since the heat spreader 33, the heat transfer sheet 41, and the adhesive 34 have an excellent thermal conductivity as described in the following, a second thermal conductive path between the heat sink 35 and the primary integrated circuit chip 31 is low in the heat resistance.

Each of the surface mount packages 23 is a small outline package (SOP), a small outline j-lead package (SOJ), a thin small outline package (TSOP), and the like. It is desirable that the height of each of the surface mount package 23 is the same for connecting fixedly to the heat sink 35. Each of the secondary integrated circuit chips is a cache memory and a peripheral circuit in which the heat generation amount is small. The heat generation amount of the secondary integrated circuit chips is one tenth of that of the primary integrated circuit chip 31. The heat spreader 33 is opposed to the primary integrated circuit chip 31 and is located just above that. The height of the heat spreader 33 is higher than that of each of the surface mount packages 23. The heat spreader 33 consists of material having both an excellent thermal conductivity and an excellent mechanical strength. The heat spreader 33 needs the excellent thermal conductivity, since the excellent thermal conductivity is easy to conduct the heat of the primary integrated circuit chip 31 to the heat sink 35. The heat spreader 33 needs the excellent mechanical strength, since the heat sink 35 is fixed to the heat spreader 33 by screwing so as not to get out the shape of the threaded hole 32. Concretely, the material of the heat spreader 33 is an alloy of aluminium, a sintered alloy of copper and molybdenum, a sintered alloy of copper and tungsten, or the like. The heat spreader 33 is fixed to the substrate 22 by an adhesive 34. The adhesive 34 consists of an excellent thermal conductive material. For example, the adhesive 34 is the solder, and the like.

Figure 7:
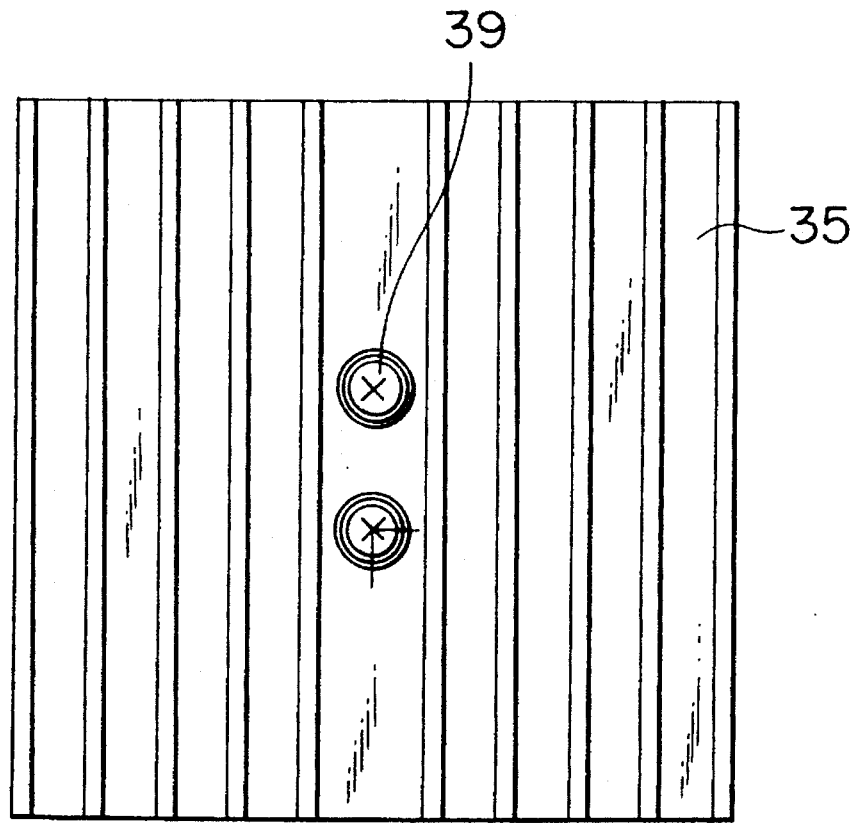
FIG. 7 is a partial plan view showing constitution of a heat sink according to a first embodiment of this invention.
Figure 8:
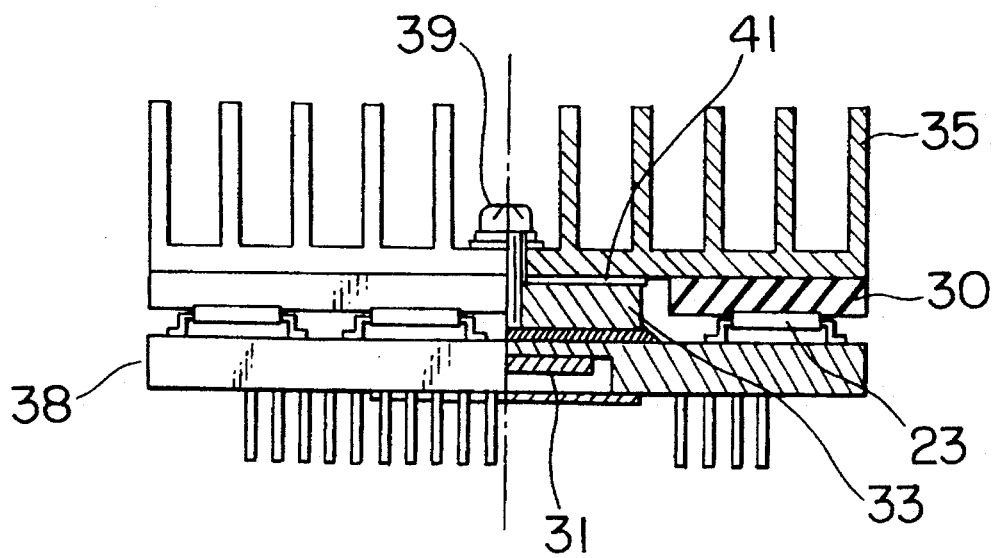
FIG. 8 is a partial sectional view showing constitution of a multi-chip package according to a first embodiment of this invention.

As shown in FIGS. 7 and 8, the heat sink 35 covers over the multi-chip module 38. The heat sink 35 consists of a plurality of fins and a base plate. The heat sink 35 has two holes 35a to insert the screw 39 at a center thereof. The heat sink 35 consists of aluminium, or the like which is excellent thermal conductive material. The flexible thermal conductive members 30 consist of an excellent thermal conductive material and an excellent flexible material. The flexible thermal conductive members 30 need the excellent thermal conductivity, since the excellent thermal conductivity is easy to conduct the heat of the surface mount packages 23 to the heat sink 35. The flexible thermal conductive members 30 need the excellent flexibility, since they absorb both the variation of height of the surface mount packages 23 and the warping of the heat sink 35. Concretely, the material of the flexible thermal conductive members 30 is a silicon rubber sheet consisting of a silicon resin and fine particles. The material of the fine particles is metal oxide, the silicon carbide, boron nitride, or the like. The heat transfer sheet consists of the soft managerial which has the excellent thermal conductive. For example, the heat transfer sheet 41 is a silicon rubber sheet, a lead foil, solder foil, or the like.

The description will proceed to thermal conduction according to the first embodiment. The heat generated from the primary integrated circuit chip 31 is conducted in the order as follows, the primary integrated circuit chip 31, the substrate 22, the adhesive 34, the heat spreader 33, the heat transfer sheet 41, and the heat sink 35.

The heat reaching to the heat sink 35 is dissipated in the air. The heat generated from the surface mount packages 23 is conducted in the order as follows, the surface mount packages 23, the flexible thermal conductive member 30, and the heat sink 35. The heat reaching to the heat sink 35 is dissipated in the air.

According to the first embodiment, since both the first thermal conductive path and the second thermal conductive path are formed simultaneously in the multi-chip package, it is possible to cool simultaneously the surface mount packages 23 and the primary integrated circuit chip 31. In detail, according to the first embodiment, there can be obtained five advantageous effects as follows.

Firstly, since the first thermal conductive path is formed by the heat spreader 33, it is possible to dissipate efficiently the heat of the primary integrated circuit chip 31 in which the heat generation amount is large. Secondly, since the second thermal conductive path is formed by the flexible thermal conductive member 30, it is possible to dissipate efficiently not only the heat of the primary integrated circuit chip 31 but that of the surface mount packages 23. Thirdly, since it is possible to dissipate efficiently the heat of the surface mount packages 23, it is unnecessary to cover the surface mount packages 23 with potting and to constitute the surface mount packages 23 as a bare chip. Therefore, it is possible to attach easily the surface mount packages 23 and to detach them easily. Fourthly, since it is not necessary to constitute the surface mount packages 23 as a bare chip, it is possible to inspect easily the secondary integrated circuit chips received in the surface mount packages 23. In addition, since it is possible to inspect the surface mount packages 23 before mounting, the yield of the multi-chip module 38 improves. Fifthly, since the heat sink 35 is fixed to the heat spreader 33 by screwing the screw 39 into the threaded hole 32, it is easy to detach the heat sink 35. Therefore, it is easy to change the surface mount packages 23 in the event of a failure.

Figure 9:
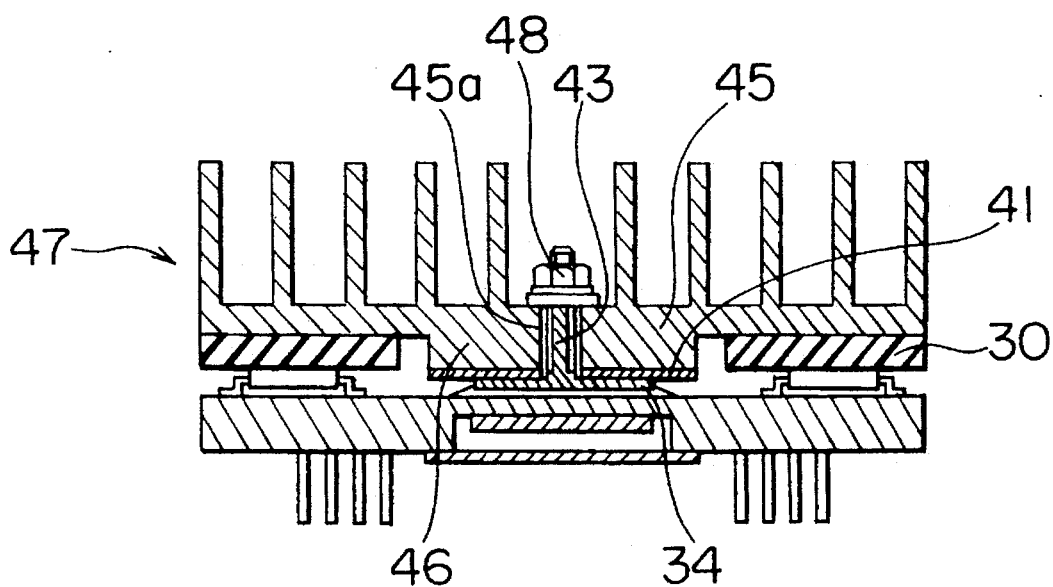
FIG. 9 is a sectional view showing constitution of a multi-chip package according to a second embodiment of this invention.

Referring to FIG. 9, the description will proceed to a multi-chip package for cooling the multi-chip module according to a second embodiment of the present invention. The illustrated multi-chip package is similar to that illustrated in FIG. 4 except that the dissipation section 37 is modified into a dissipation section 47. The similar parts are represented by the same references as in FIGS. 1 to 8.

As shown in FIG. 9, the dissipation section 47 comprises a heat sink 45, a stud member 43, and a nut 48. The heat sink 45 has a convex section 46. The convex section 46 is opposed to the primary integrated circuit chip 31. The heat sink 45 is thermally connected to the primary integrated circuit chip 31 through the convex section 46. The convex section 46 has a hole 45a at a center thereof. The stud member 43 comprises a rod section and a board section for fixing the heat sink 45 to the substrate 22 with the rod section inserted in the hole 45a and with the board section inserted between the heat sink 45 and the substrate 22. The rod section has a threaded end. The stud member 43 is composed of an excellent thermal conductive material. The stud member 43 needs the excellent thermal conductivity, since with the excellent thermal conductivity is easy to conduct heat of the primary integrated circuit chip 31 to the heat sink 45. The stud member 43 is fixed to the substrate 22 by an adhesive 34. A heat transfer sheet 41 is coated on the board section. The heat sink 45 is mounted on the heat transfer sheet 41. The heat sink 45 is thermally connected to the secondary integrated circuit chips (not shown) and to the primary integrated circuit chip 31 through the stud member 43. The heat sink 45 is fixed to the substrate 22 by screwing the nut 48 to the threaded end. The flexible thermal conductive members 30 are inserted between the surface mount packages 23 and the heat sink 45. The heat sink 45 is thermally connected to the secondary integrated circuit chips 23 through the flexible thermal conductive members 30, since both the heat sink 45 and the surface mount package 23 are bonded to the flexible thermal conductive members 30. The heat sink 45 is thermally connected to the primary integrated circuit chip 31 through the stud member 43 and the heat transfer sheet 41, since the heat sink 45 and the primary integrated circuit chip 31 are bonded to the heat transfer sheet 41 and the stud member 43, respectively.

In this case, since the flexible thermal conductive members 30 have excellent thermal conductivity as described as follows, a first thermal conductive path between the heat sink 35 and the surface mount package 23 is low in the heat resistance. Similarly, since the stud member 43, the heat transfer sheet 41, and the adhesive 34 have excellent thermal conductivity as described as follows, a second thermal conductive path between the heat sink 45 and the primary integrated circuit chip 31 is low in the heat resistance. The heat generated from the primary integrated circuit chip 31 is conducted in the order as follows, the primary integrated circuit chip 31, the substrate 22, the adhesive 34, the stud member 43, the heat transfer sheet 41, and the heat sink 45. The heat reaching to the heat sink 45 is dissipated in the air. The heat generated from the surface mount packages 23 is conducted in the order as follows, the surface mount packages 23, the flexible thermal conductive member 30, and the heat sink 45. The heat reaching to the heat sink 45 is dissipated in the air. According to the second embodiment, there can be obtained the advantageous effect similar to that of the first embodiment.

Figure 10:
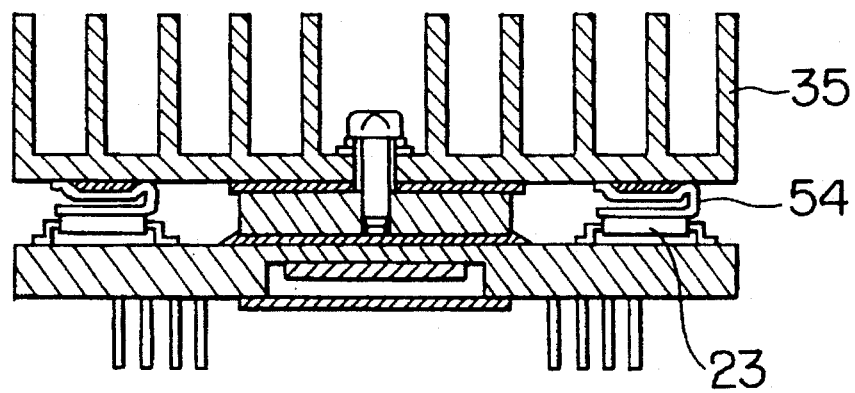
FIG. 10 is a sectional view showing constitution of a multi-chip package according to a third embodiment of this invention.

Referring to FIG. 10, the description will proceed to a multi-chip package for cooling the multi-chip module according to a third embodiment of the present invention. The illustrated multi-chip package is similar to that illustrated in FIG. 4 except that the flexible thermal conductive member 30 is modified into a thermal conductive spring 54. The similar parts are represented by the same references as in FIGS. 1 to 8.

In FIG. 10, each of the thermal conductive springs 54 is inserted between the surface mount packages 23 and the heat sink 35. The heat sink 35 is thermally connected to the secondary integrated circuit chips 23 through the thermal conductive springs 54, since both the heat sink 35 and the surface mount package 23 are bonded to the thermal conductive springs 54 by the elastic displacement. The heat generated from the surface mount packages 23 is conducted in the order as follows, the surface mount packages 23, the thermal conductive spring 54, and the heat sink 35. The heat reached to the heat sink 35 is dissipated in the air.

The thermal conductive springs 54 is composed of an excellent thermal conductive material. The thermal conductive springs 54 need the excellent thermal conductivity, since the excellent thermal conductivity makes it easy to conduct the heat of the surface mount packages 23 to the heat sink 35.

According to the third embodiment, it is possible to detach the thermal conductive springs 54, at the same time that the heat sink 35 is detached. Therefore, it is easy to change the surface mount packages 23.

In addition, according to the third embodiment, there can be obtained the advantageous effect similar to that of the first embodiment.

Figure 11:
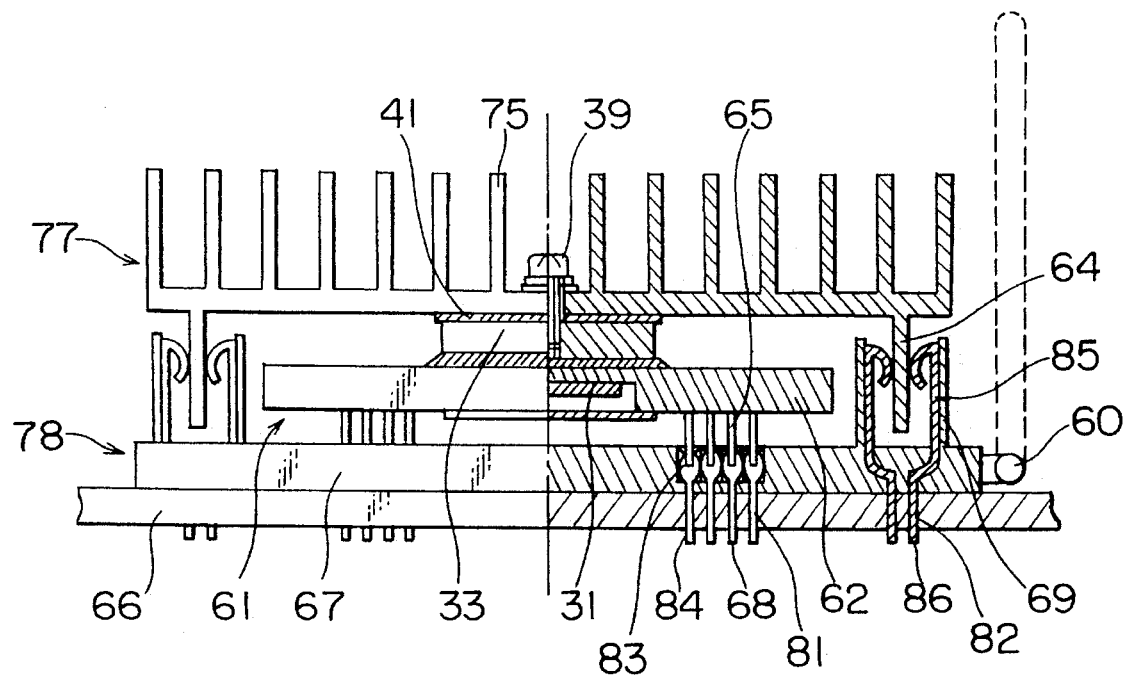
FIG. 11 is a partial sectional view showing constitution of a shielding package according to a fourth embodiment of this invention.

Referring to FIG. 11, the description will proceed to a shielding package for shielding a semiconductor device from electromagnetic interference according to a fourth embodiment of the present invention.

In FIG. 11, the shielding package comprises a dissipation section 77 and a connecting section 78. The dissipation section 77 comprises the heat spreader 33 and a heat sink 75. The connecting section 78 comprises the semiconductor device 61, a connector 67, and a wiring board 66. The semiconductor device 61 comprises a substrate 62 having upper and lower surfaces and having a plurality of input/output pins 65. The primary integrated circuit chip 31 is mounted on the lower surface of the substrate 62. The heat spreader 33 is mounted on the upper surface of the substrate 62. The heat sink 75 is thermally connected to the primary integrated circuit chip 31 through the heat spreader 33. The heat sink 75 has electrical conductivity. The heat sink 75 comprises a base plate and two connecting members 64 which perpendicularly extends from the base plate. Two connecting members 64 are plate. A wiring board 66 has a plurality of contact holes 81 and four contact slits 82. The connector 67 is mounted on the wiring board 66. The connector has a plurality of contacts 68 which comprise a plurality of socket portions 83 and a plurality of terminal portions 84. The contacts 68 are connected to the input/output pins 65 with the input/output pins 65 inserted into the respective socket portions. The terminal portions 84 are inserted into the respective contact holes 81. The connector 67 has two ground contacts 69 which comprises two ground socket portions 85 and two ground terminal portions 86. Each of two ground socket portions 85 has two ground socket elements and two ground terminal elements. Two ground contacts 69 are electrically connected to two connecting members 64 with two connecting members 64 inserted into two ground socket elements. Four ground terminal elements are inserted into four contact slits 82. Two ground contacts 69 are connected to electric ground (not shown). Both two ground contacts 69 and the primary integrated circuit chip 31 are insulated each other. The connector 67 has a lever 60 for operating an inserting/drawing mechanism formed in the connector 67. The input/output pins 65 switch by operating the lever 60. The lever 60 is formed on the outside of the heat sink 75. Therefore, it is possible to operate the lever 60 without detaching the heat sink 75. The heat sink 75 is composed of an alloy of aluminium or an alloy of copper. An electrically conductive coating is counted on the surface of the heat sink 75. For example, there is used a nickel plating as the electrically conductive coating.

The heat sink 75 has at least one heat sink hole. The heat spreader 33 is a thermally conductive mounting plate in which a threaded hole 32 is threaded. The heat sink 35 is fixed to the thermal conductive mounting plate by screwing a screw 39 into the threaded hole 32.

When the substrate 62 is connected to the wiring board 66, the input/output pins 65 are inserted in the contact holes 81. Simultaneously, two connecting members 64 are connected to two ground contact 69. Thereafter, when the lever 60 is operated by the operator, the input/output pins 65 are held by the socket portions 83. In this case, the substrate 62 moves in a direction parallel to the plane of the wiring board 66, at the same time that the heat sink 75 moves in the above-mentioned direction.

The substrate 62 is surrounded by two connecting members 64. The heat sink 75 is connected to the electric ground (not shown) through the ground contact 69. Therefore, an electromagnetic wave generated from the primary integrated circuit chip 31 is absorbed into the heat sink 75 and two connecting members 64. When the connector 67 is the connector by which the substrate 62 does not move in the inserting direction of the connecting members, it is possible to form four connecting members so that the primary integrated circuit chip 31 is surrounded by four connecting members. In the event, the electromagnetic wave from outside the connecting members is perfectly shielded.

According to the fourth embodiment, since the heat sink 75 connects to the electric ground through the ground contact 59, it is easy to attach the heat sink 75 and to detach it. In addition, since the substrate 62 is fixed to the heat sink 75, it is possible to attach the heat sink 75 and the substrate 62 simultaneously. Similarly, it is possible to detach the heat sink 75 and the substrate 62 simultaneously.

Figure 12:
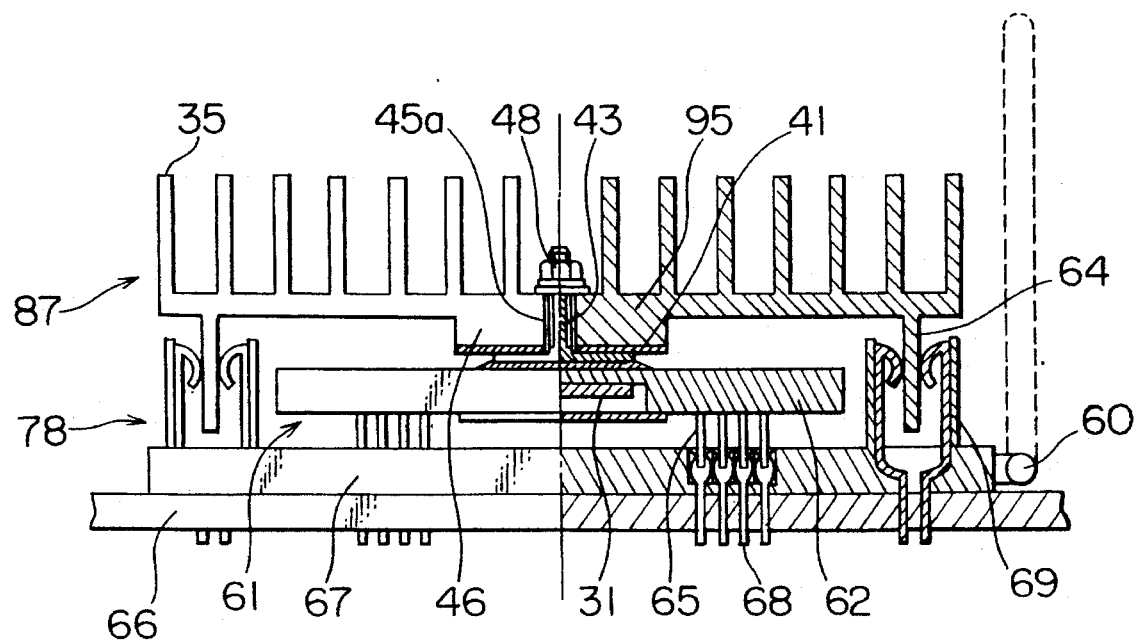
FIG. 12 is a partial sectional view showing constitution of a shielding package according to a fifth embodiment of this invention.

Referring to FIG. 12, the description will proceed to a shielding package for shielding the semiconductor device from electromagnetic interference according to a fifth embodiment of the present invention. The illustrated shielding package is similar to that illustrated in FIG. 11 except that the dissipation section 77 is modified into a dissipation section 87. The similar parts are represented by the same references as in FIG. 11.

As shown in FIG. 12, the dissipation section 87 comprises a heat sink 95, a stud member 43, and a nut 48. The heat silk 95 has a convex section 46. The convex section is opposed to the primary integrated circuit chip 31. The heat sink 95 is thermally connected to the primary integrated circuit chip 31 through the convex section. The convex section has a hole 45a at a center thereof. The stud member 43 comprises a rod section and a board section for fixing the heat sink 95 to the substrate 62 with the rod section inserted in the hole 45a and with the board section inserted between the heat sink 95 and the substrate 62. The rod section has a threaded end. The stud member 43 is composed of an excellent thermal conductive material. The stud member 43 needs the excellent thermal conductivity, since the excellent thermal conductivity is easy to conduct heat of the primary integrated circuit chip 31 to the heat sink 95. The stud member 43 is fixed to the substrate 22 by an adhesive 34. A heat transfer sheet 41 is coated on the board section. The heat sink 95 is mounted on the heat transfer sheet 41. The heat sink 95 is thermally connected to the secondary integrated circuit chips (not shown) and to the primary integrated circuit chip 31 through the stud member 43. The heat sink 45 is fixed to the substrate 62 by screwing the nut 48 to the threaded end.

According to the fifth embodiment, there can be obtained the advantageous effect similar to that of the fourth embodiment.

Figure 13:
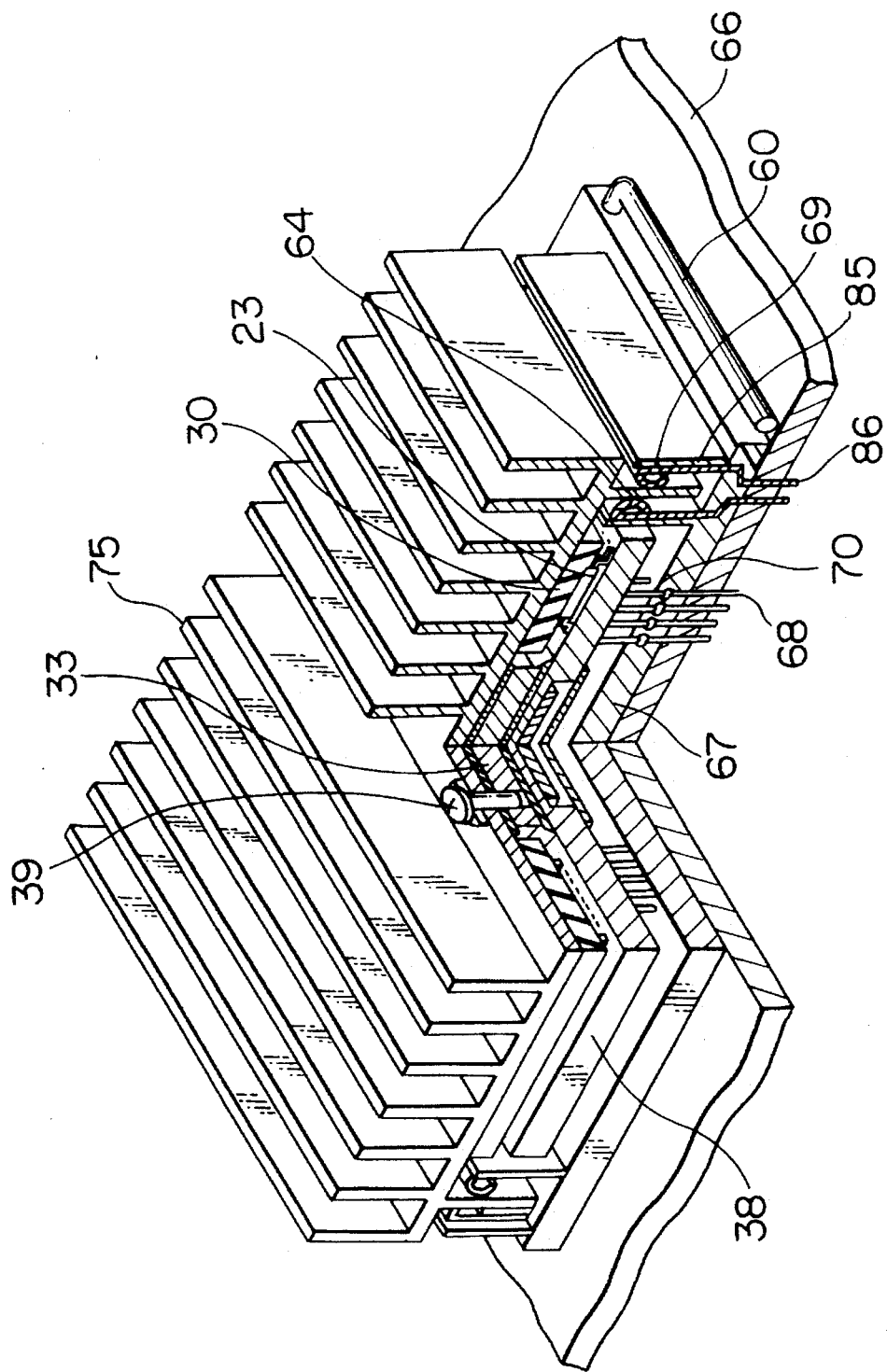
FIG. 13 is a perspective view showing constitution of a multi-chip shielding package according to a sixth embodiment of this invention, with a portion cut away.

Referring to FIG. 13, the description will proceed to a multi-chip shielding package for shielding the semiconductor device from electromagnetic interference and for cooling the multi-chip module according to a sixth embodiment of the present invention. The sixth embodiment is combination of the first embodiment and the fourth embodiment. According to the sixth embodiment, there can be obtained the advantageous effect similar to those of the first embodiment, and the fourth embodiment.

While this invention has thus far been described in conjunction with the preferred embodiments thereof, it will now readily be possible for those skilled in the art to develop various other embodiments of this invention. For example, the multi-chip package may be a combination of the second embodiment, and the third embodiment. The multi-chip shielding package may be a combination of the first embodiment and the fifth embodiment. The multi-chip shielding package may be a combination of the second embodiment and the fourth embodiment. The multi-chip shielding package may be a combination of the second embodiment and the fifth embodiment. The multi-chip shielding package may be a combination of the third embodiment and the fourth embodiment. The multi-chip shielding package may be a combination of the third embodiment and the fifth embodiment.

What is claimed is:

1. A multi-chip package for packaging a semiconductor device comprising a substrate having upper and lower surfaces, a primary integrated circuit chip mounted on the lower surface of said substrate, secondary integrated circuit chips mounted on a predetermined region of the upper surface of said substrate, said multi-chip package comprising:

a heat sink having a convex section, said convex section being opposed to said primary integrated circuit chip, said heat sink being thermally connected to said primary integrated circuit chip through said convex section, said convex section having a hole at a center thereof;

a stud member, comprising a rod section and a board section, for fixing said heat sink to said substrate with the rod section inserted in the hole and with the board section inserted between said heat sink and said substrate, the rod section having a threaded end, said stud member being fixed to said substrate by an adhesive; and a nut screwed to said threaded end, thereby fixing said heat sink to said substrate.

2. A multi-chip package as claimed in claim 1, wherein said primary integrated circuit chip has heat generation amount which is larger than that of said secondary integrated circuit chip.

3. A multi-chip package as claimed in claim 1, wherein said multi-chip package further comprises a heat transfer sheet between said heat sink and said heat spreader.

4. A shielding package for shielding a semiconductor device from electromagnetic interference, said semiconductor device comprising a substrate having lapper and lower surfaces and having a plurality of input/output pins, and an integrated circuit chip mounted on the lower surface of said substrate, said shielding package comprising:

a heat spreader mounted on the upper surface of said substrate;

a heat sink thermally connected to said integrated circuit chip through said heat spreader, said heat sink having electrical conductivity, said heat sink comprising a base plate and at least one connecting member which perpendicularly extends from the base plate;

a wiring board having a plurality of contact holes and a plurality of contact slits; and a connector mounted on said wiring board, said connector having a plurality of contacts which comprise a plurality of socket portions and a plurality of terminal portions, said contacts being connected to said input/output pins with said input/output pins inserted into the respective socket portions, the terminal portions being inserted into the respective contact holes, said connector having at least one ground contact which comprises a ground socket portion and a ground terminal portion, said at least one ground contact being electrically connected to said at least one connecting member with the connecting member inserted into the ground socket portion, the ground terminal portions being inserted into the contact slits.

5. A shielding package as claimed in claim 4, wherein said connecting members are plate.

6. A shielding package as claimed in claim 4, wherein said heat sink has at least one heat sink hole, said heat spreader being a thermal conductive mounting plate in which a threaded hole is threaded, said heat sink being fixed to said thermal conductive mounting plate by screwing a screw into said threaded hole.

7. A shielding package for shielding a semiconductor device from electromagnetic interference, said semiconductor device comprising a substrate having upper and lower surfaces and having a plurality of input/output pins, and an integrated circuit chip mounted on the lower surface of said substrate, said shielding package comprising:

a heat sink having a convex section, said convex section being opposed to said integrated circuit chip, said heat sink, having electrical conductivity, being thermally connected to said integrated circuit chip through said convex section and comprising a base plate and at least one connecting member which perpendicularly extends from the base plate, said convex section having a hole at a center thereof;

a wiring board having a plurality of contact holes and a plurality of contact slits;

a stud member, comprising a rod section and a board section, for fixing said heat sink to said substrate with the rod section inserted in the hole and with the board section inserted between said heat sink and said substrate, the rod section having a threaded end, said stud member being fixed to said wiring board by an adhesive; and a nut screwed to said threaded end, thereby fixing said heat sink to said substrate;

a connector mounted on said wiring board, said connector having a plurality of contacts which comprise a plurality of socket portions and a plurality of terminal portions, said contacts being connected to said input/output pins with said input/output pins inserted into the respective socket portions, the terminal portions being inserted into the respective contact holes, said connector having at least one ground contact which comprises a ground socket portion and a ground terminal portion, said at least one ground contact being electrically connected to said at least one connecting member with the connecting member inserted into the ground socket portion, the ground terminal portions being inserted into the contact slits.

8. A multi-chip shielding package for packaging a multi-chip module and for shielding said multi-chip module from electromagnetic interference, said multi-chip module comprising a substrate having upper and lower surfaces and having a plurality of input/output pins, a primary integrated circuit chip mounted on the lower surface of said substrate, and secondary integrated circuit chips mounted on a predetermined region of the upper surface of said substrate, said primary integrated circuit chip being mounted on the lower surface of said substrate, said multi-chip shielding package comprising:

a heat spreader mounted on a remaining region of the upper surface of said substrate;

a heat sink thermally connected to said primary integrated circuit chip through said heat spreader and to said secondary integrated circuit chips, said heat sink having electrical conductivity, said heat sink comprising a base plate and at least one connecting member which perpendicularly extends from the base plate;

a wiring board having a plurality of contact holes and a plurality of contact slits; and a connector mounted on said wiring board, said connector having a plurality of contacts which comprise a plurality of socket portions and a plurality of terminal portions, said contacts being connected to said input/output pins with said input/output pins inserted into the respective socket portions, the terminal portions being inserted into the respective contact holes, said connector having at least one ground contact which comprises a ground socket portion and a ground terminal portion, said at least one ground contact being electrically connected to said at least one connecting mender with the connecting member inserted into the ground socket portion, the ground terminal portions being inserted into the contact slits.

9. A multi-chip shielding package as claimed in claim 8, wherein said heat sink has at least one heat sink hole, said heat spreader being a thermal conductive mounting plate in which a threaded hole is threaded, said heat sink being fixed to said thermal conductive mounting plate by screwing a screw into said threaded hole.

10. A multi-chip shielding package as claimed in claim 8, wherein said multi-chip shielding package further comprises flexible thermal conductive members inserted between said secondary integrated circuit chips and said heat sink, whereby said heat sink thermally connected to said second integrated circuit chips through said flexible thermal conductive members.

11. A multi-chip shielding package as claimed in claim 8, wherein said flexible thermal conductive members consist essentially of a silicon resin.

12. A multi-chip shielding package as claimed in claim 8, wherein said multi-chip shielding package further comprises thermal conductive springs inserted between said secondary integrated circuit chips and said heat sink, whereby said heat sink is thermally connected to said secondary integrated circuit chips through said thermal conductive springs.

13. A multi-chip shielding package as claimed in claim 8, wherein said heat spreader is opposed to said primary integrated circuit chip.

14. A multi-chip shielding package as claimed in claim 8, wherein said substrate has a cavity section at the lower surface, said primary integrated circuit chip being held in the cavity section.

15. A multi-chip shielding package as claimed in claim 8, wherein said primary integrated circuit chip is bare chip.

16. A multi-chip shielding package as claimed in claim 8, wherein said integrated circuit chip is received within a surface mount type package.

17. A multi-chip shielding package as claimed in claim 8, wherein said primary integrated circuit chip has heat generation amount which is larger than that of said secondary integrated circuit chip.

18. A multi-chip shielding package as claimed in claim 8, wherein said multi-chip shielding package further comprises a heat transfer sheet between said heat sink and said heat spreader.

* * * * *

UNITED STATES PATENT AND TRADEMARK OFFICE
CERTIFICATE OF CORRECTION

PATENT NO. : 5,589,711
DATED : December 31, 1996
INVENTOR(S) : Toshifumi Sano, Masahiro Yamada, Yoshiaki Umezawa, Yoshikatsu Okada and Akira Natori It is certified that error appears in the above-indentified patent and that said Letters Patent is hereby corrected as shown below:

Claim 4, Column 10, Line 54, "lapper" should be --upper--.
Claim 8, Column 12, Line 23, "mender" should be --member--.

Signed and Sealed this

Eighth Day of April, 1997

Attest:

BRUCE LEHMAN

Attesting Officer

Commissioner of Patents and Trademarks